(12) United States Patent
Choi et al.

(10) Patent No.: US 12,738,315 B2
(45) Date of Patent: Sep. 15, 2026

(54) NEUROMORPHIC SYNAPSE DEVICE WITH EXCELLENT LINEARITY CHARACTERISTICS AND OPERATING METHOD THEREOF

(71) Applicant: Korea Advanced Institute of Science and Technology, Daejeon (KR)

(72) Inventors: Yang-Kyu Choi, Daejeon (KR); Myung-Su Kim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 1248 days.

(21) Appl. No.: 17/674,272

(22) Filed: Feb. 17, 2022

(65) Prior Publication Data

US 2022/0270676 A1 Aug. 25, 2022

(30) Foreign Application Priority Data

Feb. 23, 2021 (KR) ........................ 10-2021-0023887
Nov. 2, 2021 (KR) ........................ 10-2021-0148400

(51) Int. Cl.
*G11C 11/54* (2006.01)
*G11C 16/04* (2006.01)
(Continued)

(52) U.S. Cl.
CPC .......... *G11C 11/54* (2013.01); *G11C 16/0416* (2013.01); *H10D 30/0411* (2025.01); *H10D 30/687* (2025.01)

(58) Field of Classification Search
CPC . G11C 11/54; G11C 16/0416; H10D 30/0411; H10D 30/687; H10D 64/035; G06N 3/063; G06N 3/08
See application file for complete search history.

(56) References Cited

U.S. PATENT DOCUMENTS 6,172,368 B1 * 1/2001 Tarr ........................ G01T 1/026 250/370.07
2011/0210385 A1 * 9/2011 Lin ...................... H10D 30/681 257/E29.345
2018/0090626 A1 * 3/2018 Yamashita ............ H10D 30/69

FOREIGN PATENT DOCUMENTS

JP H08316347 A 11/1996
JP 2005294565 A 10/2005
(Continued)

OTHER PUBLICATIONS

Eunpyo Park et al., A 2D material-based floating gate device with linear synaptic weight update, Nanoscale, Issue 48, pp. 1-7, Dec. 15, 2020, https://doi.org/10.1039/DONR07403A, 9 pp.

*Primary Examiner* — Mohammad A Rahman
(74) *Attorney, Agent, or Firm* — Christensen O'Connor Johnson Kindness PLLC

(57) ABSTRACT

Disclosed are a neuromorphic synapse device having an excellent linearity characteristic, and an operating method thereof. According to an embodiment, a neuromorphic synapse device includes a channel region formed on a substrate, a gate insulating film region formed on the channel region, a floating gate region formed on the gate insulating film region, a charge transfer layer region formed on the floating gate region, and a control gate region, which is formed on the charge transfer layer region and which generates a potential difference with the floating gate region in response to a fact that a potential that is not less than a reference potential is applied, and performs a weight update operation by releasing at least one charge stored in the floating gate region or storing the at least one charge into the floating gate region by using the potential difference.

21 Claims, 10 Drawing Sheets

(51) Int. Cl.
*H10D 30/01* (2025.01)
*H10D 30/68* (2025.01)

(56) References Cited

FOREIGN PATENT DOCUMENTS

| | | | |
|---|---|---|---|
| JP | 2007042802 | A | 2/2007 |
| JP | 2013114729 | A | 6/2013 |
| JP | 2020515027 | A | 5/2020 |
| JP | 2021507519 | A | 2/2021 |
| KR | 10-0849993 | B1 | 8/2008 |
| KR | 10-2010-0078685 | A | 7/2010 |
| KR | 10-1731183 | B1 | 4/2017 |
| KR | 10-2020-0115722 | A | 10/2020 |
| WO | 2019135839 | A8 | 7/2020 |

* cited by examiner

Sphere-shaped RCAT
Source
Gate
Drain
Body

Recessed channel array transistor (RCAT)
Source
Gate
Drain
Body

NEUROMORPHIC SYNAPSE DEVICE WITH EXCELLENT LINEARITY CHARACTERISTICS AND OPERATING METHOD THEREOF

CROSS-REFERENCE TO RELATED APPLICATIONS

A claim for priority under 35 U.S.C. § 119 is made to Korean Patent Application No. 10-2021-0023887 filed on Feb. 23, 2021 and Korean Patent Application No. 10-2021-0148400 filed on Nov. 2, 2021, in the Korean Intellectual Property Office, the disclosure of each of which is hereby incorporated herein in its entirety by this reference.

BACKGROUND

Embodiments of the inventive concept described herein relate to a field effect transistor (FET)-based neuromorphic synapse device, and more particularly, relate to a neuromorphic synapse device with excellent linearity characteristics and an operating method thereof.

With the advent of the big data era, a demand for computation, processing, and storage of vast amounts of data is increasing explosively. In a computer system, Von Neumann structure that is conventionally used is a structure where a central processing unit processing and calculating data and a memory storing processed and calculated data are separated from each other. In a data exchange process between the central processing unit and the memory according to an increase in the amount of data in the big data era, bottlenecks and energy consumption need to be resolved.

As a solution to problems of the conventional computer system, there is a movement to implement a system that mimics the human brain, which is called neuromorphic computing. Unlike the conventional Von Neumann computing, a deep neural network in neuromorphic computing requires synapses having a specific weight connected in parallel and neurons passing the specific weight to the next synapse. The deep neural network may perform accurate and fast learning and inference with efficient energy consumption by performing computations based on the synapses and neurons.

Most of deep neural networks have been studied in a method of processing data by using software. However, to realize truly ultra-low-power neuromorphic computing, hardware suitable for the ultra-low-power neuromorphic computing is indispensable. Accordingly, it is essential to secure synapses and neuron devices that enable parallel operations at a device step and have energy efficiency.

For an ideal synapse device for implementing a deep neural network, there is a need for an analog weight update characteristic in which a channel conductance value is changed as the same pulse voltage is applied, potentiation and depression characteristics of a weight update that is linearly performed depending on the number of pulses, the symmetry of potentiation and depression characteristics, a non-volatile characteristic for storing an updated weight regardless of power supply, or good endurance in which a characteristic does not change even though a weight update is performed several times.

Devices such as a 2-terminal-based resistive random-access memory (RRAM), a phase-change random access memory (PcRAM), and a memristor have a principle of changing analog weights like the human nervous system by changing the resistance of a channel, through which current flows as a voltage pulse is applied, to perform a memory operation. The devices have drawn attention as a synapse device in that low-power operation and integration are possible.

However, because variable resistance characteristics of a channel through which a current flows rapidly changes due to device characteristics. Furthermore, for a 2-terminal-based synapse device, an additional selector device and secondary circuit elements are required for an overall system configuration when manufacturing in a form of an array.

To solve these problems, research on transistor-based synapse devices having three or more terminals is being actively conducted. The transistor-based synapse device may perform parallel write and read operations, and may not require an additional selector device. In particular, because a floating gate memory device is a three-terminal device and has a commercially mature technology, the floating gate memory device has drawn attention as a synapse device. However, the floating gate memory device is not used as a synapse device because the floating gate memory device has low linearity, low symmetry, and high operating voltage.

The following examples are intended to propose a structure that is capable of solving both the low linearity characteristic and the high operating voltage, which are limitations of a floating gate memory, while the high technical maturity of the conventional floating gate memory is capable of being used as it is.

SUMMARY

Embodiments of the inventive concept provide a FET-based neuromorphic synapse device with some structural changes based on a gate stack of a conventional floating gate memory to overcome the limitations of low linearity, low symmetry, and high operating voltage characteristics, which are limitations of a floating gate memory-based synapse, while having the excellent technological maturity of the conventional floating gate memory, and an operating method thereof.

However, the technical problems to be solved by the inventive concept are not limited to the above problems, and may be variously expanded without departing from the technical spirit and scope of the inventive concept.

According to an exemplary embodiment, a neuromorphic synapse device includes a channel region formed on a substrate, a gate insulating film region formed on the channel region, a floating gate region formed on the gate insulating film region, a charge transfer layer region formed on the floating gate region, and a control gate region, which is formed on the charge transfer layer region and which generates a potential difference with the floating gate region in response to a fact that a potential that is not less than a reference potential is applied, and performs a weight update operation by releasing at least one charge stored in the floating gate region or storing the at least one charge into the floating gate region by using the potential difference.

According to one aspect, the control gate region implements weight depression by releasing the at least one charge stored in the floating gate region and implements weight potentiation by storing the at least one charge into the floating gate region.

According to another aspect, the control gate region implements weight depression and weight potentiation in a method in which conductance between a source region and a drain region is changed in response to a fact that the at least one charge passes through an energy barrier by the charge transfer layer region due to a potential difference with the floating gate region.

According to another aspect, an area of the control gate region or an area of the charge transfer layer region is smaller than an area of the floating gate region.

According to another aspect, the control gate region is formed of at least one material of a metal, a two or three metal alloy, n+ polycrystalline silicon, p+ polycrystalline silicon, or silicide.

According to another aspect, the charge transfer layer region is formed of at least one material of silicon (Si), germanium (Ge), group III-V compound, 2-D material, silicon nitride ($Si_3N_4$), nitride, silicon oxynitride (SiON), silicon oxide ($SiO_2$), oxide, aluminum oxide ($Al_2O_3$), IGZO, hafnium oxide ($HfO_2$), a charge transfer material, a semiconductor material, or a solid electrolyte material.

According to another aspect, the floating gate region has one structure among a protruded gate structure including a planar-gate structure, a multiple-gate structure, and a gate-all-around structure or a buried gate structure depending on a structure of the channel region.

According to another aspect, the floating gate region has the protruded gate structure used in one of a finFET, a tri-gate MOSFET, a Π-gate MOSFET, a Ω-gate MOSFET, a gate-all-around MOSFET, a bulk finFET, or a bulk gate-all-around MOSFET.

According to another aspect, the floating gate region has the buried gate structure used in at least one of a buried gate MOSFET, a recessed gate MOSFET, a sphere-shaped recessed gate MOSFET, a saddle finFET, a groove gate MOSFET, or a V-groove gate MOSFET.

According to another aspect, the floating gate region is formed of at least one material of a metal, a two or three metal alloy, n+ polycrystalline silicon, p+ polycrystalline silicon, or silicide.

According to another aspect, the gate insulating film region is formed of at least one of silicon oxide ($SiO_2$), silicon nitride ($Si_3N_4$), silicon oxynitride (SiON), hafnium oxide ($HfO_2$), aluminum oxide ($Al_2O_3$), zirconium oxide ($ZrO_2$), hafnium zirconium oxide (HZO), or hafnium oxynitride (HfON).

According to another aspect, the neuromorphic synapse device further includes a source region and a drain region are formed on left and right sides of the channel region when the neuromorphic synapse device is implemented as a horizontal transistor, and is formed at upper and lower ends of the channel region when the neuromorphic synapse device is implemented as a vertical transistor.

According to another aspect, the source region and the drain region are formed of one of n-type silicon, p-type silicon, or metal silicide.

According to another aspect, when the source region and the drain region are formed of the n-type silicon or the p-type silicon, the source region and the drain region are formed based on at least one method of diffusion, solid-phase diffusion, epitaxial growth, selective epitaxial growth, ion implantation or subsequent heat treatment.

According to another aspect, when the source region and the drain region are formed of the metal silicide, bonding is improved by using dopant segregation.

According to another aspect, the channel region, the source region, and the drain region are formed of materials identical to one another.

According to another aspect, the channel region, the source region, and the drain region are formed of at least one of silicon, germanium, silicon-germanium, strained silicon, strained germanium, strained silicon-germanium, silicon on insulator (SOI), or group III-V semiconductor materials.

According to another aspect, the channel region has either a protruded channel structure or a buried channel structure, which includes a planar structure, a fin structure, a nanosheet structure, or a nanowire structure.

According to another aspect, the channel region has the protruded channel structure used in one of a finFET, a tri-gate MOSFET, a Π-gate MOSFET, a Ω-gate MOSFET, a gate-all-around MOSFET, a bulk finFET, or a bulk gate-all-around MOSFET.

According to another aspect, the channel region has the buried channel structure used in at least one of a buried gate MOSFET, a recessed gate MOSFET, a sphere-shaped recessed gate MOSFET, a saddle finFET, a groove gate MOSFET, or a V-groove gate MOSFET.

According to an exemplary embodiment, an operating method of a neuromorphic synapse device including a channel region formed on a substrate, a gate insulating film region formed on the channel region, a floating gate region formed on the gate insulating film region, a charge transfer layer region formed on the floating gate region, and a control gate region formed on the charge transfer layer region includes generating a potential difference with the floating gate region in response to a fact that a potential that is not less than a reference potential is applied and performing a weight update operation by using the potential difference. The perform of the weight update operation includes one of implementing weight depression by releasing at least one charge stored in the floating gate region or implementing weight potentiation by storing the at least one charge into the floating gate region.

According to an exemplary embodiment, a manufacturing method of a neuromorphic synapse device includes preparing a transistor structure including a channel region formed on a substrate, a gate insulating film region formed on the channel region, and a floating gate region formed on the gate insulating film region, forming a charge transfer layer region on the floating gate region in the transistor structure, and forming a control gate region on the charge transfer layer region.

According to an exemplary embodiment, a neuromorphic synapse device includes a channel region formed on a substrate, a gate insulating film region formed on the channel region, a floating gate region formed on the gate insulating film region, a charge transfer layer region formed on the floating gate region, and a control gate region formed on the charge transfer layer region. The control gate region generates a potential difference with the floating gate region in response to a fact that a potential that is not less than a reference potential is applied, and performs a weight update operation by releasing at least one charge stored in the floating gate region or storing the at least one charge into the floating gate region by using the potential difference. A charge for the weight update operation is moved between the control gate region and the floating gate region.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 3 is a cross-sectional view illustrating a cross-section of a neuromorphic synapse device taken along line I-I' shown in FIG. 2;

FIG. 6 is a flowchart illustrating an operating method of the neuromorphic synapse device shown in FIG. 1;

FIG. 7 is a graph from directly measuring a drain current $I_D$ with respect to a control gate voltage $V_G$ of the neuromorphic synapse device shown in FIG. 1;

DETAILED DESCRIPTION

Figure 1:
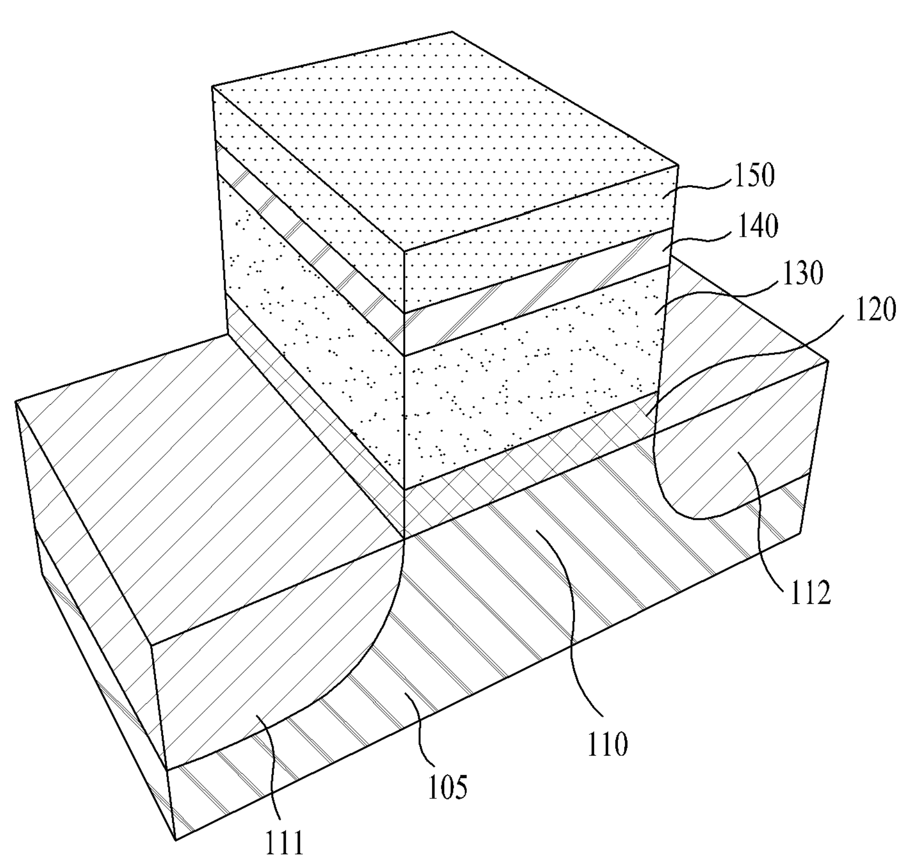
FIG. 1 is a perspective view illustrating a neuromorphic synapse device, according to an embodiment.

Hereinafter, a description will be given in detail for exemplary embodiments of the present invention with reference to the following drawings. However, the inventive concept are not limited or restricted by the embodiments. Further, the same reference signs/numerals in the drawings denote the same members.

Furthermore, the terminologies used herein are used to properly express the embodiments of the inventive concept, and may be changed according to the intentions of a viewer or the manager or the custom in the field to which the inventive concept pertains. Therefore, definition of the terms should be made according to the overall disclosure set forth herein. For example, in the specification, the singular forms include plural forms unless particularly mentioned. Furthermore, the terms “comprises” and/or “comprising” used herein does not exclude presence or addition of one or more other components, steps, operations, and/or elements in addition to the aforementioned components, steps, operations, and/or elements.

Moreover, it should be understood that various embodiments of the inventive concept are not necessarily mutually exclusive although being different from each other. For example, specific shapes, structures, and characteristics described herein may be implemented in other embodiments without departing from the spirit and scope of the inventive concept in relation to one embodiment. Besides, it should be understood that the location, arrangement, or configuration of individual components in each of presented categories of an embodiment may be changed without departing from the spirit and scope of the inventive concept.

Hereinafter, a neuromorphic synapse device according to an embodiment may be implemented as a three-terminal floating gate memory that is a field effect transistor. During a weight update operation, the neuromorphic synapse device has high linearity and symmetry in weight potentiation and weight depression characteristics and the weight potentiation and depression graphs appear in the form of Greek capital letters “Λ (Lambda)”, and thus it may be named “Λ-synapse”.

Figure 2:
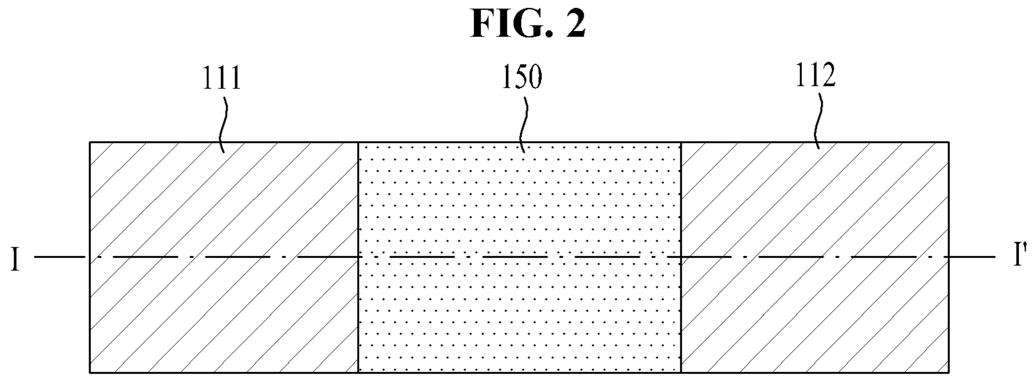
FIG. 2 is a plan view illustrating the neuromorphic synapse device shown in FIG. 1.
Figure 3:
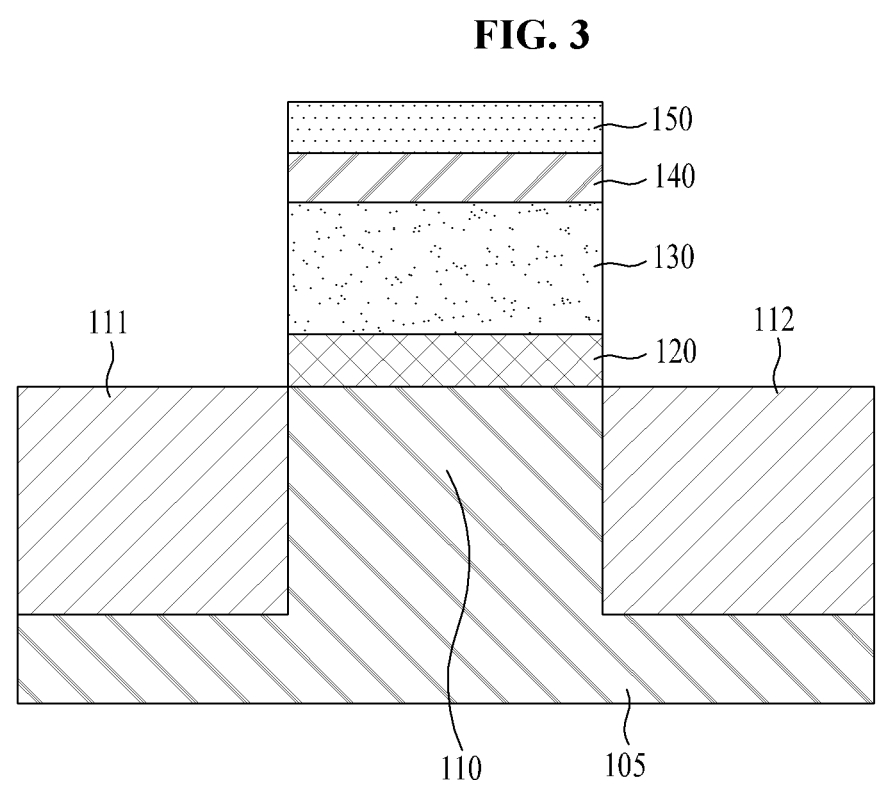
Figure 4:
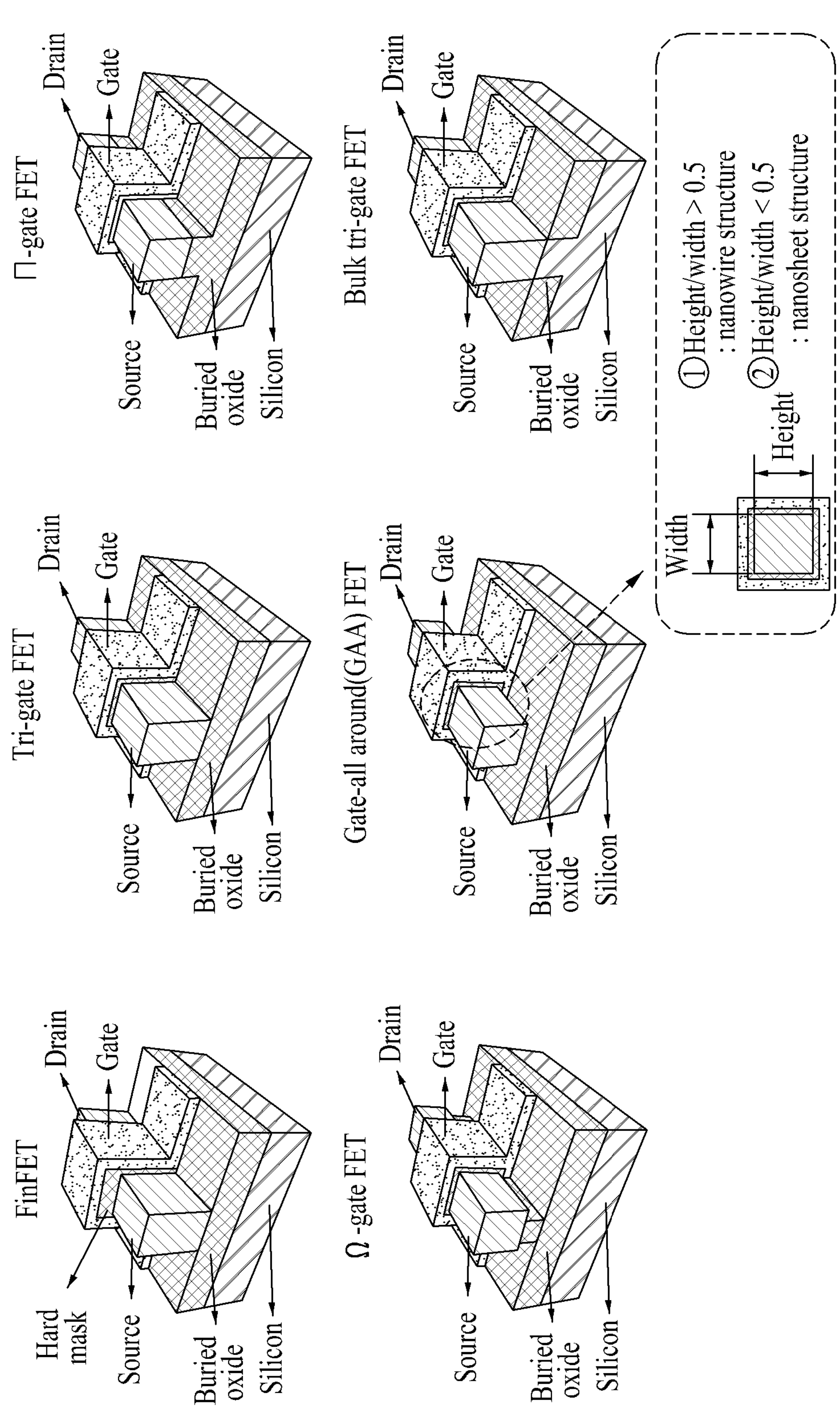
FIG. 4 is a perspective view illustrating various protruded gate FET structures to describe a structure of a channel region and a floating gate region included in the neuromorphic synapse device shown in FIG. 1.
Figure 5:
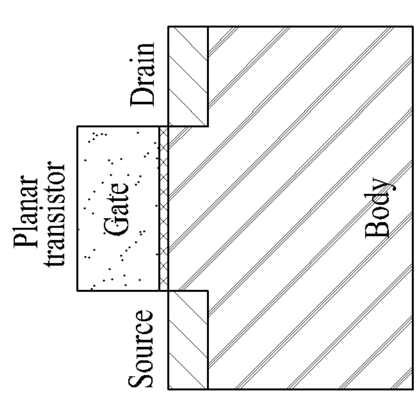
FIG. 5 is a cross-sectional view illustrating various protruded gate FET structures to describe a structure of a channel region and a floating gate region included in the neuromorphic synapse device shown in FIG. 1.

FIG. 1 is a perspective view illustrating a neuromorphic synapse device, according to an embodiment. FIG. 2 is a plan view illustrating the neuromorphic synapse device shown in FIG. 1. FIG. 3 is a cross-sectional view illustrating a cross-section of a neuromorphic synapse device taken along line I-I' shown in FIG. 2. FIG. 4 is a perspective view illustrating various protruded gate FET structures to describe a structure of a channel region and a floating gate region included in the neuromorphic synapse device shown in FIG. 1. FIG. 5 is a cross-sectional view illustrating various protruded gate FET structures to describe a structure of a channel region and a floating gate region included in the neuromorphic synapse device shown in FIG. 1.

According to an embodiment, a neuromorphic synapse device has a structure in which a charge transfer layer region and a control gate region are arranged on the gate of a conventional MOSFET. The neuromorphic synapse device may have a structure in which various MOSFETs used in the field are located at the lower portion. For example, the neuromorphic synapse device may have a structure in which a charge transfer layer region and a control gate region are arranged on the MOSFET of a protruded structure or a buried structure shown in FIGS. 4 and 5 in addition to a planar MOSFET shown in FIGS. 1 to 3.

Referring to FIGS. 1 to 3, according to an embodiment, a neuromorphic synapse device 100 may include a channel region 110 formed on a substrate 105, a source region 111 and a drain region 112 formed on both left and right sides of the channel region 110, a gate insulating film region 120 formed on the channel region 110, a floating gate region 130 formed on the gate insulating film region 120, a charge transfer layer region 140 formed on the floating gate region 130, and a control gate region 150 formed on the charge transfer layer region 140.

The substrate 105 may be formed of at least one of silicon, germanium, silicon-germanium, strained silicon, strained germanium, strained silicon-germanium, silicon on insulator (SOI), or group III-V semiconductor materials.

The channel region 110 may have either a protruded channel structure or a buried channel structure, which includes a planar structure, a fin structure, a nanosheet structure, or a nanowire structure.

For example, the channel region 110 may have the protruded channel structure used in one of a finFET, a tri-gate MOSFET, a Π-gate MOSFET, a Ω-gate MOSFET, a gate-all-around MOSFET, a bulk finFET, or a bulk gate-all-around MOSFET. For a more specific example, as shown in FIG. 4, the channel region 110 may be formed to have a protruded channel structure such as a nanosheet structure having a channel aspect ratio (height/width) of 0.5 or less, a nanowire structure having a channel aspect ratio of 0.5 or more, a multi-nanowire structure, or the like.

As another example, as shown in FIG. 5, the channel region 110 may be formed to have a buried channel structure used in at least one of a buried gate MOSFET, a recessed gate MOSFET, a sphere-shaped recessed gate MOSFET, a saddle finFET, a groove gate MOSFET, or a V-groove gate MOSFET.

It is described that the source region 111 and the drain region 112 are formed on the left and right sides of the channel region 110 as the neuromorphic synapse device 100 is implemented as a horizontal transistor as shown in the drawing. However, it is not limited thereto. For example, when the neuromorphic synapse device 100 is implemented as a vertical transistor, the source region 111 and the drain region 112 may be formed at upper and lower ends of the channel region 110.

At this time, the source region 111 and the drain region 112 may be formed of one of n-type silicon, p-type silicon, or metal silicide. For example, when formed of n-type silicon or p-type silicon, the source region 111 and the drain region 112 may be formed based on at least one method of diffusion, solid-phase diffusion, epitaxial growth, selective epitaxial growth, ion implantation or subsequent heat treatment. When the source region 111 and the drain region 112 are formed of the metal silicide such as tungsten (W), titanium (Ti), cobalt (Co), nickel (Ni), erbium (Er), ytterbium (Yb), samarium (Sm), yttrium (Y), gadorium (Gd), turbul (Tb), cerium (Ce), platinum (Pt), lead (Pb), or iridium (Ir), bonding may be improved by using dopant segregation.

The source region 111 and the drain region 112 may be formed of the same material as the channel region 110. For example, the channel region 110, the source region 111, and the drain region 112 may be formed of at least one of silicon, germanium, silicon-germanium, strained silicon, strained germanium, strained silicon-germanium, silicon on insulator (SOI), or group III-V semiconductor materials. However, it is not limited thereto. For example, the channel region 110, the source region 111, and the drain region 112 may be formed of different materials from one another.

The gate insulating film region 120 may be a component that insulates the floating gate region 130 and the channel region 110 and may be formed of any insulating material that does not have memory characteristics. For example, the gate insulating film region 120 may be formed of at least one of silicon oxide ($SiO_2$), silicon nitride ($Si_3N_4$), silicon oxynitride (SiON), hafnium oxide ($HfO_2$), aluminum oxide ($Al_2O_3$), zirconium oxide ($ZrO_2$), hafnium zirconium oxide (HZO), or hafnium oxynitride (HfON).

The floating gate region 130 may be formed of at least one material of a metal, a two or three metal alloy, n+ polycrystalline silicon, p+ polycrystalline silicon, or silicide. Because the floating gate region 130 is positioned between the control gate region 150 and the channel region 110, it may be referred to as an "internal gate". Here, the silicide may include, for example, tungsten silicide ($WSi_2$), titanium silicide ($TiSi_2$), cobalt silicide (CoSi or $CoSi_2$), nickel silicide (NiSi or $NiSi_2$), and the like.

As such, according to the structure of the channel region 110, the floating gate region 130 may have one structure among a protruded gate structure including a multiple-gate structure and a gate-all-around structure, which are shown in FIG. 4, or a buried gate structure shown in FIG. 5 as well as a planar-gate structure.

For example, the floating gate region 130 may have the protruded gate structure used in one of a finFET, a tri-gate MOSFET, a Π-gate MOSFET, a Ω-gate MOSFET, a gate-all-around MOSFET, a Bulk finFET, or a bulk gate-all-around MOSFET.

As another example, the floating gate region 130 may have the buried gate structure used in at least one of a buried gate MOSFET, a recessed gate MOSFET, a sphere-shaped recessed gate MOSFET, a saddle finFET, a groove gate MOSFET, or a V-groove gate MOSFET.

The charge transfer layer region 140 may be a component insulating the floating gate region 130 and the control gate region 150, and may be formed of at least one material of silicon (Si), germanium (Ge), group III-V compound, 2-D material (at least one of carbon nanotube, MoS2, and graphene), silicon nitride ($Si_3N_4$), nitride, silicon oxynitride (SiON), silicon oxide ($SiO_2$), oxide, aluminum oxide ($Al_2O_3$), IGZO, hafnium oxide ($HfO_2$), a charge transfer material, a semiconductor material ($SrTiO_3$, $SrZrO_3$, NiO, $TiO_2$, $HfO_x$, $AlO_x$, $NiO_x$, $TiO_x$, $TaO_x$, TaN, $Cu_xO$, $CuO_x$, TiN, TaN, $WO_x$, $SiN_x$, $VO_2$, $IrO_2$, $ZrO_x$, ZnO, $NbO_x$, IGZO, HZO, HfON), or a solid electrolyte material (a sulfide-based material[$Li_{10}GeP_2S_{12}$, $Li_{9.54}Si_{1.74}P_{1.44}S_{11.7}C_{10.3}$, argyrodite, lithium phosphorus sulfide (LPS), LPS+ LiCl], an oxide-based material [perovskite, NASICON($Na_{1+x}Zr_2SixP_{3-x}O_{12}$, $0<x<3$), LISICON($Li_{2+2x}Zn_{1-x}GeO_4$), LiPON($Li_xPO_yN_z$), garnet], or an ion conductive polymer [polyethylene oxide (PEO), polyethylene glycol (PEG), polyethylene glycol dimethacrylate (PEGDMA), polytetrafluoroethylene (PTFE), polyether ether ketone (PEEK), or nafion ($C_7HF_{13}O_5S.C_2F_4$)]). That is, the charge transfer layer region 140 may be composed of a single material having one of the selected materials described above, or may be composed of a mixture of the above-mentioned materials.

The control gate region 150 may generate a potential difference with the floating gate region 130 in response to a fact that a potential that is not less than a reference potential is applied, and may perform a weight update operation by releasing at least one charge stored in the floating gate region 130 or storing at least one charge into the floating gate region 130 by using the potential difference.

That is, in such a method in which the conductance between the source region 111 and the drain region 112 is changed in response to a fact that at least one charge passes through an energy barrier by the charge transfer layer region 140 due to a potential difference with the floating gate region 130, the control gate region 150 may implement weight depression by releasing at least one charge stored in the floating gate region 130 and may implement weight potentiation by storing at least one charge into the floating gate region 130. For example, as at least one charge is stored into the control floating gate region 130 when a positive voltage is applied to the control gate region 150, an increase in conductance between the source region 111 and the drain region 112 may result in weight potentiation. As another example, as at least one charge stored in the control floating gate region 130 is released when a negative voltage is applied to the control gate region 150, a decrease in conductance between the source region 111 and the drain region 112 may result in weight depression.

At this time, in response to a fact that an electric potential is applied to the control gate region 150, the charge transfer layer region 140 supplies a transition current to the floating gate region 130 depending on the potential difference between gates at both ends. To this end, the control gate region 150 may be formed adjacent to the floating gate region 130 through the charge transfer layer region 140.

The control gate region 150 may be formed of at least one material of a metal, a two or three metal alloy, n+ polycrystalline silicon, p+ polycrystalline silicon, or silicide (tungsten silicide ($WSi_2$), titanium silicide ($TiSi_2$), cobalt silicide (CoSi or $CoSi_2$) or nickel silicide (NiSi or $NiSi_2$), or the like).

In particular, an area of the control gate region 150 or an area of the charge transfer layer region 140 may be smaller than an area of the floating gate region 130. Accordingly, an area where the control gate region 150 or the charge transfer layer region 140 is in contact with the floating gate region 130 is smaller than the total area of the floating gate region 130. However, it is not limited thereto. For example, under the premise that the area where the control gate region 150 or the charge transfer layer region 140 is in contact with the floating gate region 130 is smaller than the total area of the floating gate region 130, each area may be equal to or greater than the area of the floating gate region 130.

As described above, in an embodiment, all of the channel region 110, the source region 111, and the drain region 112 may be formed on the substrate 105. For example, the channel region 110 may be formed to have a nanowire structure. In this case, as shown in FIG. 3, the gate insulating film region 120, the floating gate region 130, the charge transfer layer region 140, and the control gate region 150 may be formed to sequentially surround a portion of the channel region 110. An empty space may be present between the rest of the channel region 110 and the substrate 105. In other words, the channel region 110 may be supported by the components 120, 130, 140, 150 so as to float like a bridge on the substrate 105.

Figure 6:
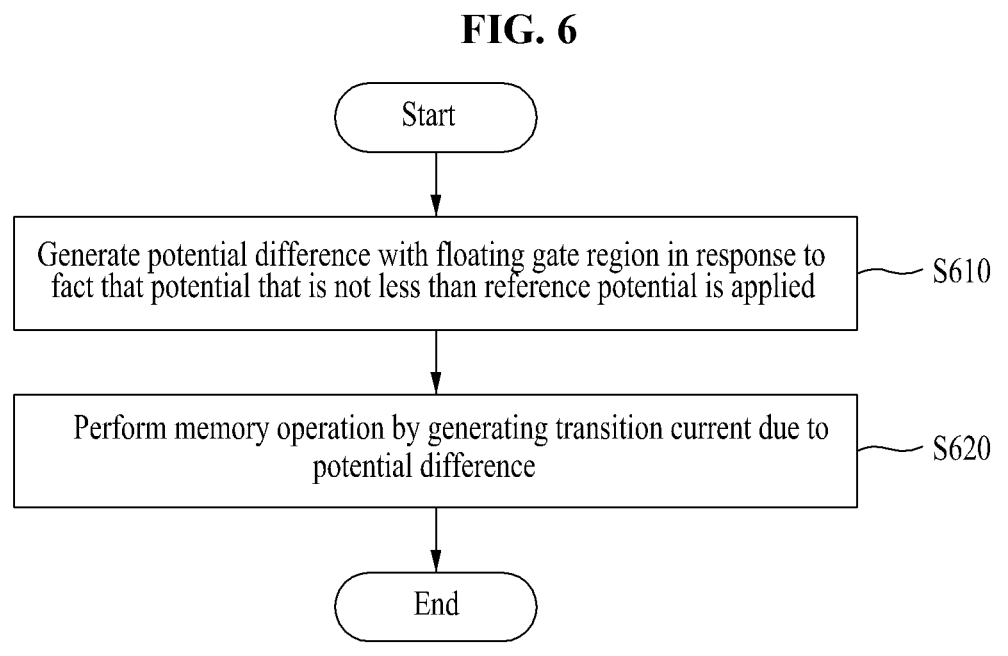

FIG. 6 is a flowchart illustrating an operating method of the neuromorphic synapse device shown in FIG. 1. Hereinafter, an operating method to be described may be performed by the neuromorphic synapse device 100 (more precisely, the control gate region 150) described with reference to FIGS. 1 to 3.

Referring to FIG. 6, in operation S610, the neuromorphic synapse device 100 may generate a potential difference with the floating gate region 130 in response to a fact that a potential that is not less than a reference potential is applied.

Accordingly, in operation S620, the neuromorphic synapse device 100 may perform a weight update operation by using the potential difference. In more detail, in operation S620, the neuromorphic synapse device 100 may implement weight depression by releasing at least one charge stored in the floating gate region 130 and may implement weight potentiation by storing at least one charge into the floating gate region 130. That is, in operation S620, in such a method in which the conductance between the source region 111 and the drain region 112 is changed in response to a fact that at least one charge passes through an energy barrier by the charge transfer layer region 140 due to a potential difference with the floating gate region 130, the neuromorphic synapse device 100 may implement weight depression by releasing at least one charge stored in the floating gate region 130 and may implement weight potentiation by storing at least one charge into the floating gate region 130.

Figure 7:
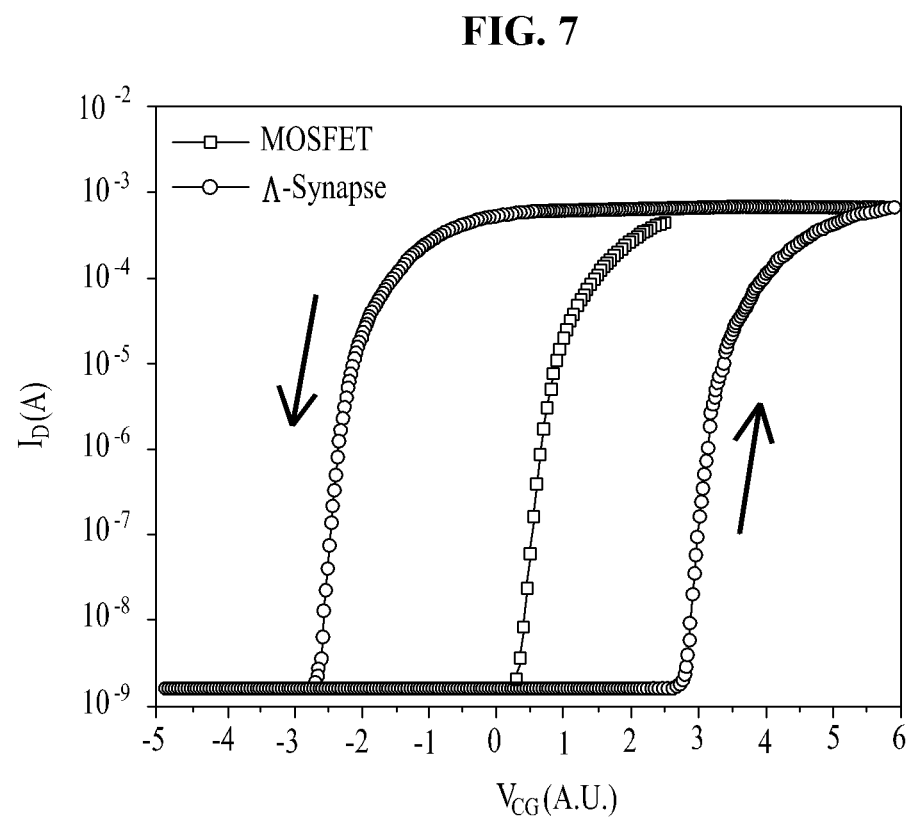

FIG. 7 is a graph from directly measuring a drain current $I_D$ with respect to a control gate voltage $V_G$ of the neuromorphic synapse device shown in FIG. 1.

Referring to FIG. 7, when a potential having a value greater than or equal to a reference voltage is applied to the control gate region 150, the graph shows a counterclockwise hysteresis curve. That is, when a positive voltage is applied to the control gate region 150, a threshold voltage $V_T$ of the neuromorphic synapse device 100 may move to the left. When a negative voltage is applied to the control gate region 150, the threshold voltage $V_T$ of the neuromorphic synapse device 100 may move to the right.

This counterclockwise hysteresis curve has a characteristic opposite to the characteristic of a clockwise hysteresis curve for the conventional floating gate memory. The reason is as follows. For the conventional floating gate memory, charges moves between a floating gate region and a channel region when a gate insulating film region delivers the charges. On the other hand, in the neuromorphic synapse device 100, because the charge transfer layer region 140 is disposed on the floating gate region 130, charges moves between the floating gate region 130 and the control gate region 150. For example, as an electric field is generated in a direction from the control gate region 150 to the channel region 110 when a positive voltage is applied to the control gate region 150, electrons in the conventional floating gate memory may move from a channel region to a floating gate region, that is, electrons may be accumulated in the floating gate region. On the other hand, in the neuromorphic synapse device 100, electrons may move from the floating gate region 130 to the control gate region 150, that is, electrons may be released from the floating gate region 130. In other words, because locations of materials for delivering charges are different from one another, the neuromorphic synapse device 100 may indicate a hysteresis curve characteristic opposite to that of the conventional floating gate memory.

Figure 8:
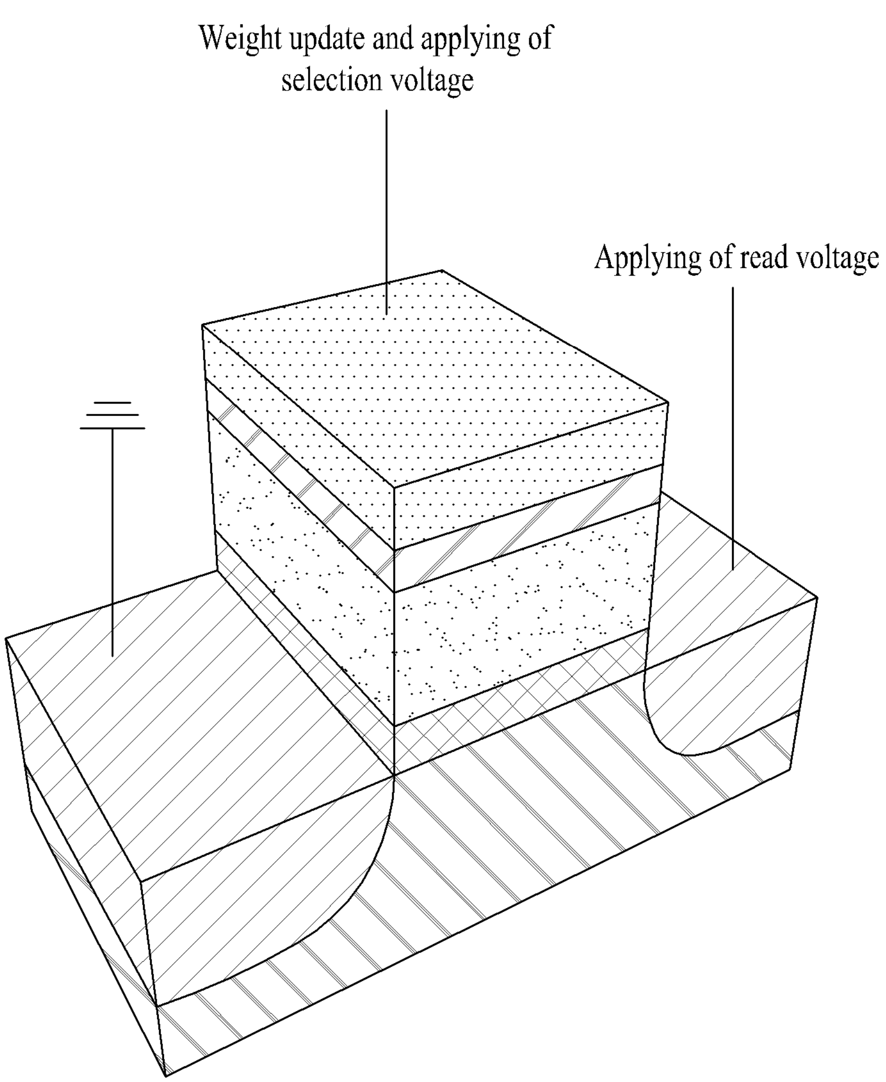
FIG. 8 is a diagram schematically illustrating a synapse characteristic measurement environment of the neuromorphic synapse device shown in FIG. 1.

FIG. 8 is a diagram schematically illustrating a synapse characteristic measurement environment of the neuromorphic synapse device shown in FIG. 1.

Referring to FIG. 8, a potential and voltage pulse for weight update may be applied to the control gate region 150. For example, as at least one charge is stored into the control floating gate region 130 when a positive voltage is applied to the control gate region 150, the conductance between the source region 111 and the drain region 112 may increase, and thus weight potentiation may occur. As at least one charge stored in the control floating gate region 130 is released when a negative voltage is applied to the control gate region 150, the conductance between the source region 111 and the drain region 112 may decrease, and thus weight depression may occur.

Figure 9:
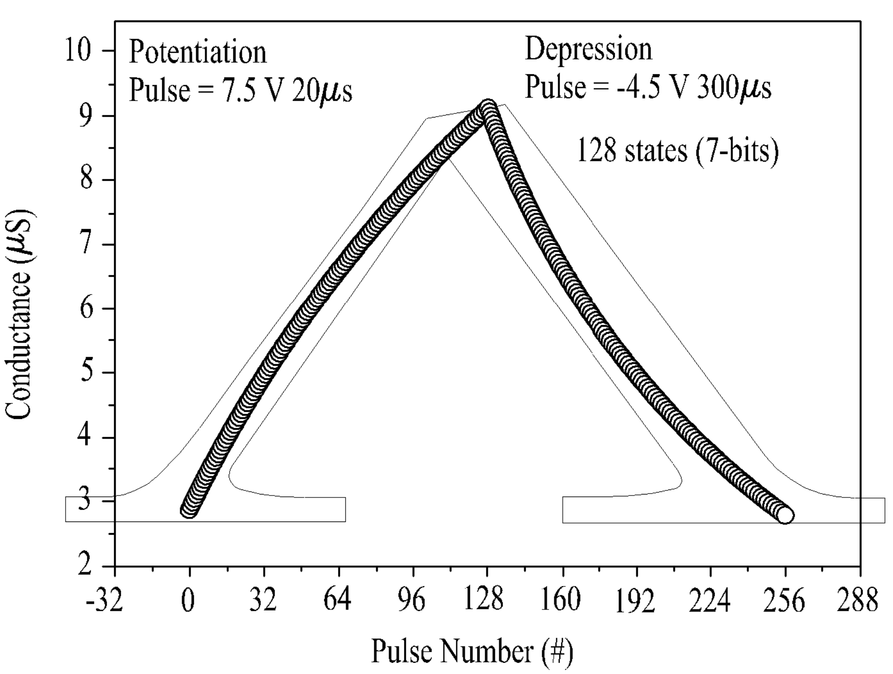
FIG. 9 is a graph illustrating weight potentiation and weight depression characteristics measured under the synapse characteristic measurement environment of FIG. 8.

FIG. 9 is a graph illustrating weight potentiation and weight depression characteristics measured under the synapse characteristic measurement environment of FIG. 8.

FIG. 9 is a graph illustrating weight potentiation and weight depression characteristics obtained by using silicon nitride of 5 nm as the charge transfer layer 140. Referring to FIG. 9, the analysis result indicates that linearity and symmetry are very excellent, and thus it may be seen that the shape of a potentiation-depression characteristic is similar to the shape of letter 'Λ (Lambda)'. In addition, it may be seen that a device operates at a voltage of 7.5 V or less, which is very lower than an operating voltage of a floating gate memory, which is conventionally known to be 11 V or more.

According to an embodiment, as compared to the conventional floating gate memory, it is easy for the neuromorphic synapse device 100 to optimize the synapse characteristic and operating voltage. The reason is that a charge transfer material is capable of being easily changed while maintaining switching characteristics of the entire synapse device. As described above, the excellent synapse characteristics shown in FIG. 9 are obtained by using silicon nitride as the charge transfer layer 140. For the neuromorphic synapse device 100 according to an embodiment, the gate insulating film region 120 and the charge transfer layer region 140 are separated from each other. Accordingly, even though a material such as silicon nitride is used as the charge transfer layer region 140, the switching characteristic of the entire device does not deteriorate. On the other hand, for the conventional floating gate memory, a charge transfer material is a gate insulating film region in contact with a channel. When a material (e.g., silicon nitride or the like) having poor interface characteristics with a channel region is used as a charge transfer material, the switching characteristic of the entire device deteriorates. When the switching characteristic of the entire device deteriorates, an additional selector device is required for a synapse array operation. That is, according to an embodiment, it is easy for the neuromorphic synapse device 100 to optimize a synapse characteristic and an operating voltage. The excellent synapse characteristic shown in FIG. 9 is obtained based on the advantages of the neuromorphic synapse device 100.

Figure 10:
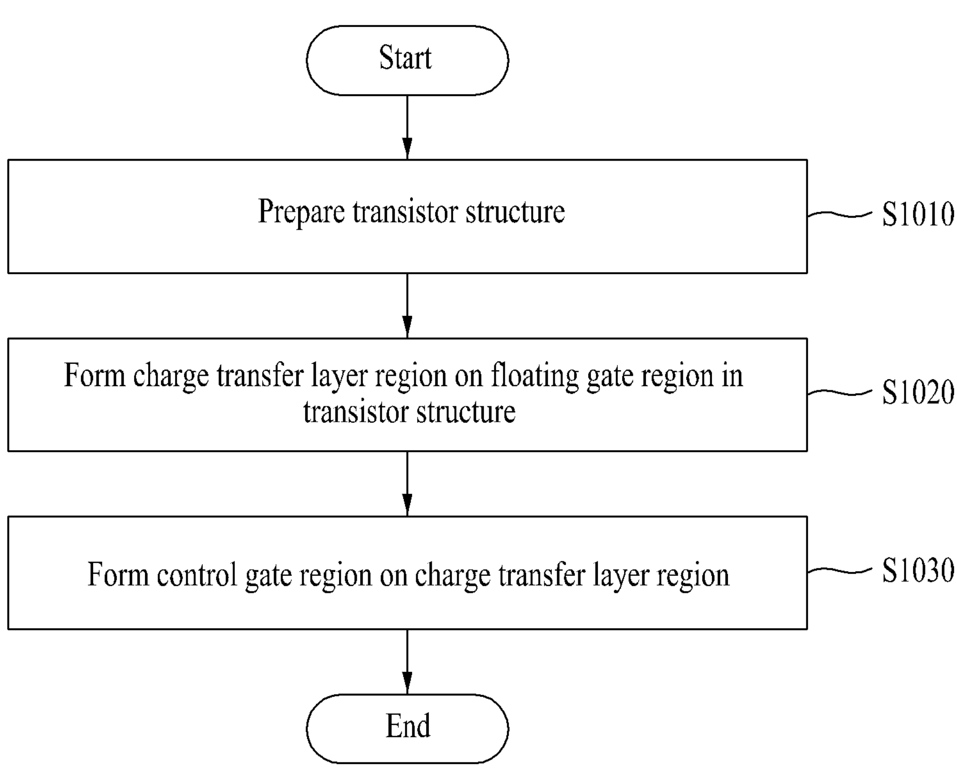
FIG. 10 is a flowchart illustrating a manufacturing method of the neuromorphic synapse device shown in FIG. 1.

FIG. 10 is a flowchart illustrating a manufacturing method of the neuromorphic synapse device shown in FIG. 1. Hereinafter, a manufacturing method may be performed by an automated and mechanized manufacturing system. The neuromorphic synapse device 100 having a structure described with reference to FIGS. 1 to 3 may be obtained by performing the manufacturing method. As such, each of components (the channel region 110, the source region 111 and the drain region 112, the gate insulating film region 120, the floating gate region 130, the charge transfer layer region 140, and the control gate region 150) included in the neuromorphic synapse device 100 may be composed of the structure and composition described with reference to FIGS. 1 to 3.

Referring to FIG. 10, in operation S1010, the manufacturing system according to an embodiment may prepare a transistor structure including the channel region 110 formed on a substrate, the gate insulating film region 120 formed on the channel region 110, and the floating gate region 130 formed on the gate insulating film region 120.

Then, in operation S1020, the manufacturing system may form the charge transfer layer region 140 on the floating gate region 130 in the transistor structure.

Afterwards, in operation S1030, the manufacturing system may form the control gate region 150 on the charge transfer layer region 140.

The neuromorphic synapse device 100 described above may be applied to various devices and systems. For example, the neuromorphic synapse device 100 may be usefully utilized in various electronic devices such as a mobile phone, a smartphone, a personal digital assistant (PDA), a portable multimedia player (PMP), a digital camera, a camcorder, a personal computer (PC), a server computer, a workstation, a notebook PC, a digital TV, a set-top box, a music player, a portable game console, a navigation device, a wearable device, an IoT device, a VR device, an AR device, and the like.

While a few embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

Embodiments may implement high linearity, high symmetry, and low operating voltage while taking advantage of the high technical maturity of a floating gate memory, by proposing a FET-based neuromorphic synapse device and an operating method thereof, which have some structural changes based on a gate stack of a conventional floating gate memory.

However, the effects of the inventive concept are not limited to the effects, and may be variously expanded without departing from the spirit and scope of the inventive concept.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A neuromorphic synapse device comprising:
a channel region formed on a substrate;
a gate insulating film region formed on the channel region;
a floating gate region formed on the gate insulating film region;
a charge transfer layer region formed on the floating gate region; and
a control gate region formed on the charge transfer layer region, wherein the control gate region is configured to:
generate a potential difference with the floating gate region in response to a fact that a potential that is not less than a reference potential is applied; and
perform a weight update operation by releasing at least one charge stored in the floating gate region or storing the at least one charge into the floating gate region by using the potential difference;
wherein movement of the at least one charge for the weight update operation occurs between the control gate region and the floating gate region through the charge transfer layer region, the charge transfer layer region being formed considering only weight update characteristics.

2. The neuromorphic synapse device of claim 1, wherein the control gate region implements weight depression by releasing the at least one charge stored in the floating gate region and implements weight potentiation by storing the at least one charge into the floating gate region.

3. The neuromorphic synapse device of claim 2, wherein the control gate region implements the weight depression and the weight potentiation in a method in which conductance between a source region and a drain region is changed in response to a fact that the at least one charge passes through an energy barrier by the charge transfer layer region due to the potential difference with the floating gate region.

4. The neuromorphic synapse device of claim 1, wherein an area of the control gate region or an area of the charge transfer layer region is smaller than an area of the floating gate region.

5. The neuromorphic synapse device of claim 1, wherein the control gate region is formed of at least one material of a metal, a two or three metal alloy, n+ polycrystalline silicon, p+ polycrystalline silicon, or silicide.

6. The neuromorphic synapse device of claim 1, wherein the charge transfer layer region is formed of at least one material of silicon (Si), germanium (Ge), group III-V compound, 2-D material, silicon nitride ($Si_3N_4$), nitride, silicon oxynitride (SiON), silicon oxide ($SiO_2$), oxide, aluminum oxide ($Al_2O_3$), IGZO, hafnium oxide ($HfO_2$), a charge transfer material, a semiconductor material, or a solid electrolyte material.

7. The neuromorphic synapse device of claim 1, wherein the floating gate region has one structure among a protruded gate structure including a planar-gate structure, a multiple-gate structure, and a gate-all-around structure or a buried gate structure depending on a structure of the channel region.

8. The neuromorphic synapse device of claim 7, wherein the floating gate region has the protruded gate structure used in one of a finFET, a tri-gate MOSFET, a Π-gate MOSFET, a Ω-gate MOSFET, a gate-all-around MOSFET, a bulk finFET, or a bulk gate-all-around MOSFET.

9. The neuromorphic synapse device of claim 7, wherein the floating gate region has the buried gate structure used in at least one of a buried gate MOSFET, a recessed gate MOSFET, a sphere-shaped recessed gate MOSFET, a saddle finFET, a groove gate MOSFET, or a V-groove gate MOSFET.

10. The neuromorphic synapse device of claim 1, wherein the floating gate region is formed of at least one material of a metal, a two or three metal alloy, n+ polycrystalline silicon, p+ polycrystalline silicon, or silicide.

11. The neuromorphic synapse device of claim 1, wherein the gate insulating film region is formed of at least one of silicon oxide ($SiO_2$), silicon nitride ($Si_3N_4$), silicon oxynitride (SiON), hafnium oxide ($HfO_2$), aluminum oxide ($Al_2O_3$), zirconium oxide ($ZrO_2$), hafnium zirconium oxide (HZO), or hafnium oxynitride (HfON).

12. The neuromorphic synapse device of claim 1, further comprising:

a source region and a drain region formed on left and right sides of the channel region when the neuromorphic synapse device is implemented as a horizontal transistor, and formed at upper and lower ends of the channel region when the neuromorphic synapse device is implemented as a vertical transistor.

13. The neuromorphic synapse device of claim 12, wherein the source region and the drain region are formed of one of n-type silicon, p-type silicon, or metal silicide.

14. The neuromorphic synapse device of claim 13, wherein, when the source region and the drain region are formed of the n-type silicon or the p-type silicon, the source region and the drain region are formed based on at least one method of diffusion, solid-phase diffusion, epitaxial growth, selective epitaxial growth, ion implantation or subsequent heat treatment.

15. The neuromorphic synapse device of claim 13, wherein, when the source region and the drain region are formed of the metal silicide, bonding is improved by using dopant segregation.

16. The neuromorphic synapse device of claim 12, wherein the channel region, the source region, and the drain region are formed of materials identical to one another.

17. The neuromorphic synapse device of claim 16, wherein the channel region, the source region, and the drain region are formed of at least one of silicon, germanium, silicon-germanium, strained silicon, strained germanium, strained silicon-germanium, silicon on insulator (SOI), or group III-V semiconductor materials.

18. The neuromorphic synapse device of claim 1, wherein the channel region has either a protruded channel structure or a buried channel structure, which includes a planar structure, a fin structure, a nanosheet structure, or a nanowire structure.

19. The neuromorphic synapse device of claim 18, wherein the channel region has the protruded channel structure used in one of a finFET, a tri-gate MOSFET, a Π-gate MOSFET, a Ω-gate MOSFET, a gate-all-around MOSFET, a bulk finFET, or a bulk gate-all-around MOSFET.

20. The neuromorphic synapse device of claim 18, wherein the channel region has the buried channel structure used in at least one of a buried gate MOSFET, a recessed gate MOSFET, a sphere-shaped recessed gate MOSFET, a saddle finFET, a groove gate MOSFET, or a V-groove gate MOSFET.

21. An operating method of a neuromorphic synapse device including a channel region formed on a substrate, a gate insulating film region formed on the channel region, a floating gate region formed on the gate insulating film region, a charge transfer layer region formed on the floating gate region, and a control gate region formed on the charge transfer layer region, the method comprising:

generating a potential difference with the floating gate region in response to a fact that a potential that is not less than a reference potential is applied; and performing a weight update operation by using the potential difference, wherein the perform of the weight update operation includes one of:

implementing weight depression by releasing at least one charge stored in the floating gate region; or implementing weight potentiation by storing the at least one charge into the floating gate region;

wherein movement of the at least one charge for the weight update operation occurs between the control gate region and the floating gate region through the charge transfer layer region, the charge transfer layer region being formed considering only weight update characteristics.

* * * * *